(12) United States Patent
Cheng et al.

(10) Patent No.: US 8,097,888 B2
(45) Date of Patent: Jan. 17, 2012

(54) PACKAGE CARRIER FOR EFFECTIVELY BLOCKING OPTICAL SIGNAL TRANSMISSION BETWEEN LIGHT EMITTING DEVICE AND LIGHT RECEIVING DEVICE

(75) Inventors: Chu-Liang Cheng, Taipei County (TW); Chi-Hua Wang, Taipei (TW)

(73) Assignee: Elite Advanced Laser Corporation, Taipei Hsien (TW)

( * ) Notice: Subject to any disclaimer, the term of this patent is extended or adjusted under 35 U.S.C. 154(b) by 84 days.

(21) Appl. No.: 12/577,219

(22) Filed: Oct. 12, 2009

(65) Prior Publication Data

US 2011/0057203 A1 Mar. 10, 2011

(30) Foreign Application Priority Data

Sep. 9, 2009 (TW) ................ 98216654 U

(51) Int. Cl.
*H01L 27/15* (2006.01)
*H01L 29/267* (2006.01)
*H01L 31/12* (2006.01)
*H01L 33/00* (2010.01)

(52) U.S. Cl. ................ 257/81; 257/82; 257/84; 257/88

(58) Field of Classification Search ............ 257/80, 257/81, 82, 83, 84, 88, 666, 670, 672, 678, 257/E31.122, 79, 431, 432
See application file for complete search history.

(56) References Cited

U.S. PATENT DOCUMENTS

| | | | | |
|---|---|---|---|---|
| 2001/0026665 A1* | 10/2001 | Ando et al. | ...................... | 385/94 |
| 2004/0017978 A1* | 1/2004 | Kuhara et al. | ................... | 385/49 |
| 2004/0184495 A1* | 9/2004 | Kondo | ............... | 372/36 |
| 2008/0191227 A1* | 8/2008 | Kimura et al. | ................... | 257/98 |
| 2009/0067779 A1* | 3/2009 | Furuyama | ....................... | 385/14 |

* cited by examiner

*Primary Examiner* — Ha Tran T Nguyen
*Assistant Examiner* — Thanh Y Tran
(74) *Attorney, Agent, or Firm* — Jianq Chyun IP Office

(57) ABSTRACT

A package carrier suitable for carrying at least one light emitting device and at least one light receiving device includes a carrier substrate and a metal sheet. The carrier substrate includes a first carrying area and a second carrying area. The light emitting device is disposed in the first carrying area and the light receiving device is disposed in the second carrying area. The metal sheet is disposed in the carrier substrate and located between the first carrying area and the second carrier area, for blocking optical signal transmission between the light emitting device and the light receiving device.

12 Claims, 2 Drawing Sheets

PACKAGE CARRIER FOR EFFECTIVELY BLOCKING OPTICAL SIGNAL TRANSMISSION BETWEEN LIGHT EMITTING DEVICE AND LIGHT RECEIVING DEVICE

CROSS-REFERENCE TO RELATED APPLICATION

This application claims the priority benefit of Taiwan application serial no. 98216654, filed on Sep. 9, 2009. The entirety of the above-mentioned patent application is hereby incorporated by reference herein and made a part of specification.

BACKGROUND OF THE INVENTION

1. Field of the Invention

The present invention relates to a package carrier, and more particularly, to a package carrier for carrying a light emitting semiconductor device and a light receiving semiconductor device.

2. Description of Related Art

Nowadays, electronic devices are being developed to be lighter, thinner, shorter and smaller. Because the electronic devices generally have a small size and light weight, optical detecting devices disposed in the electronic devices are also being designed to be smaller and smaller.

In general, in many commercially available optical detecting devices, a light emitting unit and a receiving unit are packaged separately and are also mounted separately during use. However, in order to reduce cost, size and facilitate assembly thereof, it has become a trend that the light emitting unit and receiving unit are mounted within a single carrier, for example, the light emitting unit and receiving unit are disposed in a two-carrying-area carrier of a plastic material. The carrier is, for example, a leadframe or a printed circuit board (PCB). Because an isolation wall of the plastic material or an inner layer of the bottom PCB cannot completely block optical signals inter-transmission to the light receiving unit, especially when the distance between the light emitting unit and the receiving unit is becoming shorter and shorter, the functional sensitivity and reliability of the optical detecting device can be significantly degraded. For the above reasons, a ceramic carrier has been developed to replace the plastic two-carrying-area carrier to avoid the optical signal transmission between the light emitting unit and the receiving unit through the carrier. However, the ceramic carrier has a high cost thus increasing the fabrication cost of the optical detecting device. In addition, attaching a metal case around each of the light emitting unit and receiving unit has also been proposed to avoid the optical signal of the light emitting unit from being transmitted to the receiving unit. However, this way not only increases the overall size of the optical detecting device, but the fabrication cost of the optical detecting unit is also increased. What is desired, therefore, is to reduce the size as well as the fabrication cost of the optical detecting device.

SUMMARY OF THE INVENTION

Accordingly, the present invention is directed to a package carrier for carrying a light emitting device and a light receiving device at the same time which can effectively block optical signal transmission between the light emitting device and the light receiving device.

The present invention provides a package carrier for carrying at least one light emitting device and at least one light receiving device. The package carrier comprises a carrier substrate and a metal sheet. The carrier substrate comprises a first carrying area and a second carrying area. The light emitting device is disposed in the first carrying area, and the light receiving device is disposed in the second carrying area. The metal sheet is disposed in the carrier substrate and located between the first carrying area and the second carrier area, for blocking optical signal transmission between the light emitting device and the light receiving device.

According to one embodiment, both the length and width of the carrier substrate are less than 10 mm and the height of the carrier substrate is less than 2.0 mm.

According to one embodiment, the light emitting device is adapted to emit a light, and the light includes visible light or invisible light.

According to one embodiment, the light receiving device comprises a signal processing unit for processing a light signal received by the light receiving device, and a control unit for controlling the light emitting device.

According to one embodiment, the package carrier further comprises a plurality of metal contacts. Each of the metal contacts comprises an inner pin portion and an outer pin portion. The carrier substrate further comprises at least one first recess disposed in the first carrying area and at least one second recess disposed in the second carrying area. The inner pin portions of the metal contacts are disposed in the first recess and the second recess respectively. The light emitting device is disposed in the first recess, and the light receiving device is disposed in the second recess. The light emitting device and light receiving device are electrically connected with the inner pin portions of the metal contacts via wire bonding.

According to one embodiment, the outer pin portions of the metal contacts are exposed from the carrier substrate, and the carrier substrate is electrically connected with an external circuit via the outer pin portions of the metal contacts.

According to one embodiment, the inner pin portions of the metal contacts in the first recess are electrically connected with the inner pin portions of the metal contacts in the second recess via the metal sheet.

According to one embodiment, the metal contacts and the metal sheet are formed at the same time.

According to one embodiment, the package carrier further comprises a plurality of metal contacts disposed in the first carrying area and the second carrying area respectively, and the light emitting device and the light receiving device are electrically connected with the metal contacts via wire bonding.

According to one embodiment, bottom portions of the metal contacts are exposed from a bottom portion of the carrier substrate, and the carrier substrate is electrically connected with an external circuit via the bottom portions of the metal contacts.

According to one embodiment, the metal contacts and the metal sheet are formed at the same time.

According to one embodiment, the material of the carrier substrate comprises plastic.

In view of the foregoing, the package carrier of the present invention includes the carrier substrate and the metal sheet. The carrier substrate has the first carrying area and the second carrying area. Therefore, the carrier substrate can carry the light emitting device and the light receiving device in the first carrying area and the second carrying area at the same time. This can effectively reduce the size of the whole package. In addition, the metal sheet is disposed between the first carrying area and the second carrying area, which can effectively block the optical signal transmission between the light emitting device and the light receiving device.

In order to make the aforementioned and other features and advantages of the present invention more comprehensible, embodiments accompanied with figures are described in detail below.

DESCRIPTION OF THE EMBODIMENTS

Figure 1:
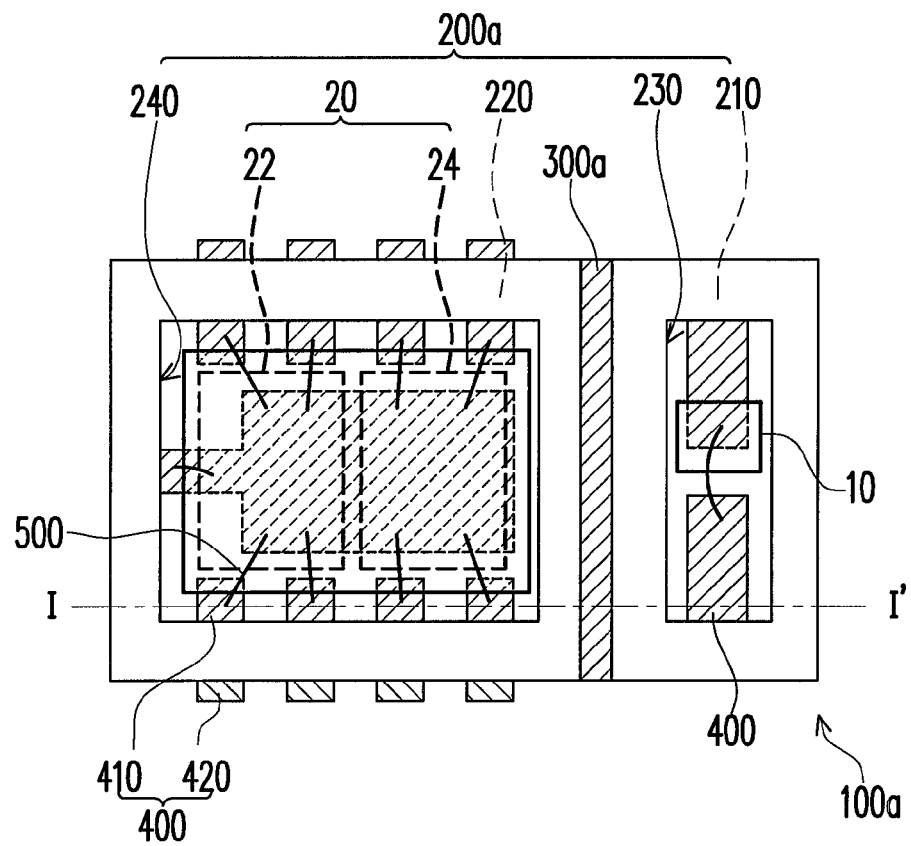
FIG. 1 is a top view of a package carrier according to one embodiment of the present invention.
Figure 2:
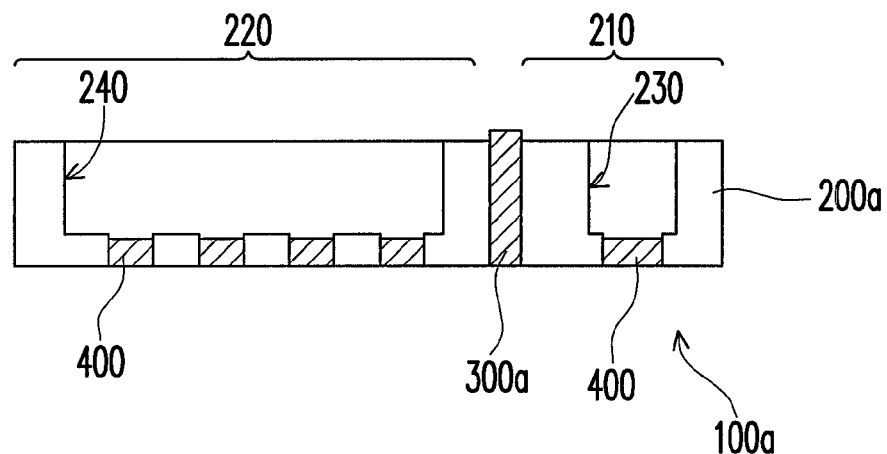
FIG. 2 is cross-sectional view of FIG. 1 taken along line I-I' thereof.

FIG. 1 is a top view of a package carrier according to one embodiment of the present invention, and FIG. 2 is cross-sectional view of FIG. 1 taken along line I-I'. Referring to FIGS. 1 and 2, in the present embodiment, the package carrier 100a is suitable for carrying at least one light emitting device 10 (only one light emitting device 10 is illustrated in FIG. 1) and at least one light receiving device 20 (only one light receiving device 20 is illustrated). The light emitting device 10 is, for example, a light emitting diode for emitting a light (not shown). The light is, for example, visible light or invisible light. The light mentioned herein is, for example, emitted upward with a portion of the light being reflected toward the light receiving device 20 by a foreign object. The light receiving device 20 includes a signal processing unit 22 and a control unit 24. The signal processing unit 22 is used to process an optical signal (not shown) received by the light receiving device 20. The control unit 24 is used to control the light emitting device 10. In the present embodiment, the light receiving device 20 may have the function of receiving an environmental light and sending out a signal.

The package carrier 100a includes a carrier substrate 200a and a metal sheet 300a. The carrier substrate 200a has a first carrying area 210, a second carrying area 220, at least one first recess 230 (only one first recess 230 is illustrated in FIG. 1) located in the first carrying area 210, and at least one second recess 240 (only one second recess 240 is illustrated in FIG. 1) located in the second carrying area 220. The light emitting device 10 is disposed in the first carrying area 210 and located inside the first recess 230. The light receiving device 20 is disposed in the second carrying area 220 and located inside the second recess 240. In particular, in the present embodiment, both the length and width of the carrier substrate 200a are less than 10 mm, and the height of the carrier substrate 200a is less than 2.0 mm. Because the carrier substrate 200a can carry the light emitting device 10 and the light receiving device 20 in the first recess 230 and the second recess 240 at the same time, the size of the whole package can be effectively reduced to meet the small-size requirements. In addition, the material of the carrier substrate 200a is, for example, plastic.

The metal sheet 300a is disposed in the carrier substrate 200a and located between the first carrying area 210 and the second carrying area 220. The height of the metal sheet 300a is substantially greater than or equal to the height of the carrier substrate 200a. In the present embodiment, because the metal sheet 300a is disposed between the first carrying area 210 and the second carrying area 220, and the height of the metal sheet 300a is substantially greater than the height of the carrier substrate 200a, optical signals can be effectively blocked from being transmitted between the light emitting device 10 and the light receiving device 20. In other words, this can avoid the optical signals generated by the light emitting device 10 to be directly received by the light receiving device 20. It should be noted, however, that the height of the metal sheet 300a may also be less than the height of the carrier substrate 200a in alternative embodiments not illustrated without departing from the spirit of the present invention, as long as the metal sheet 300a is indeed able to block the optical signals from being transmitted between the light emitting device 10 and the light receiving device 20. In addition, the material of the metal sheet 300a is, for example, copper, aluminum or iron.

The carrier substrate 100a of the present embodiment further includes a plurality of metal contacts 400. Each metal contact 400 has an inner pin portion 410 and an outer pin portion 420. The inner pin portions 410 are disposed in the first recess 230 and the second recess 240 respectively. The outer pin portions 420 of the metal contacts 400 are exposed out of the carrier substrate 200a. The light emitting device 10 and the light receiving device 20 can be electrically connected to the inner pin portions 410 of the metal contacts 400 by a plurality of lead wires 500 via wire bonding, and electrically connected to an external circuit (not shown) via the exposed outer pin portions 420 of the metal contacts 400.

It is noted that, in the present embodiment, the carrier substrate 200a is fabricated by injection-molding, and the metal contacts 400 and the metal sheet 300a can be formed at the same time. Specifically, a metal material, for example, a gold plating copper plate with a thickness of 250 um, is stamped to form the metal contacts 400 and the metal sheet 300a. That is, the material of the metal contacts 400 and the material of the metal sheet 300a may be the same. Then, the formed metal contacts 400 and metal sheet 300a together with a plastic material are used to form the carrier substrate 200a by injection-molding. Fabrication of the package carrier 100a is thus completed.

To be brief, since the carrier substrate 200a of the present embodiment has the first recess 230 in the first carrying area 210 and the second recess 240 in the second carrying area 220, the carrier substrate 200a can carry the light emitting device 10 in the first recess 230 and, carry the light receiving device 20 in the second recess 240 at the same time. In addition, the optical signal transmission between the light emitting device 10 and the light receiving device 20 can be effectively blocked by the metal sheet 300a disposed between the first carrying area 210 and the second carrying area 220. Furthermore, since the metal material and the plastic are used to form the package carrier 100a by stamping and injection-molding in the present embodiment, the fabrication cost can be effectively reduced in the present embodiment when compared with the conventional approach of fabricating from the ceramic material. In other words, the package carrier 100a of the present embodiment has the advantages of being able to reduce cost, reduce the size of the whole package as well as facilitate assembly of semiconductor devices (e.g. the light emitting device 10, light receiving device 20).

Figure 3:
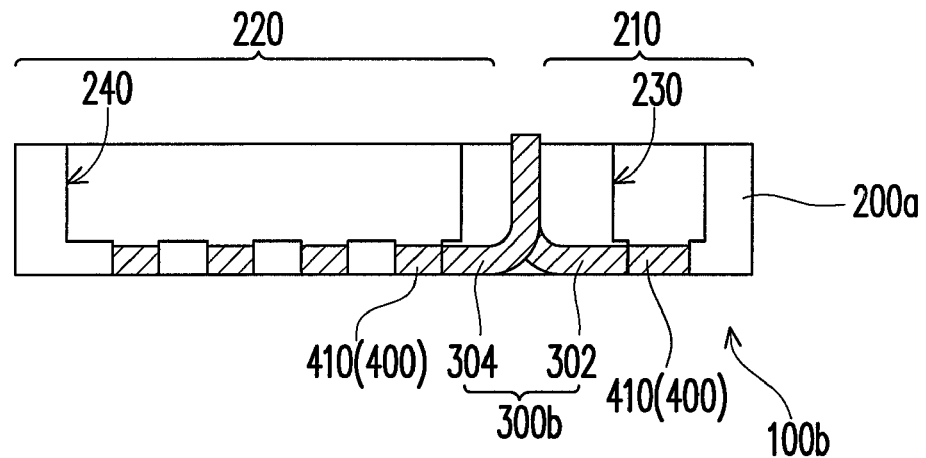
FIG. 3 is a cross-sectional view of a package carrier according to another embodiment of the present invention.

FIG. 3 is a cross-sectional view of a package carrier according to another embodiment of the present invention. Referring to FIGS. 2 and 3, the package carrier 100b of FIG. 3 is similar to the package carrier 100a of FIG. 2 except that the metal sheet 300b of the package carrier 100b of FIG. 3 includes a first metal portion 302 and a second metal portion 304. The first metal portion 302 is electrically connected with the inner pin portion 410 of the metal contact 400 disposed in the first recess 230. The second metal portion 304 is electrically connected with the inner pin portion 410 of the metal contact 400 disposed in the second recess 240. In other words, the metal contact 400 in the first recess 230 may be electrically connected with the metal contact 400 in the second recess 240 via the metal sheet 300b.

Figure 4:
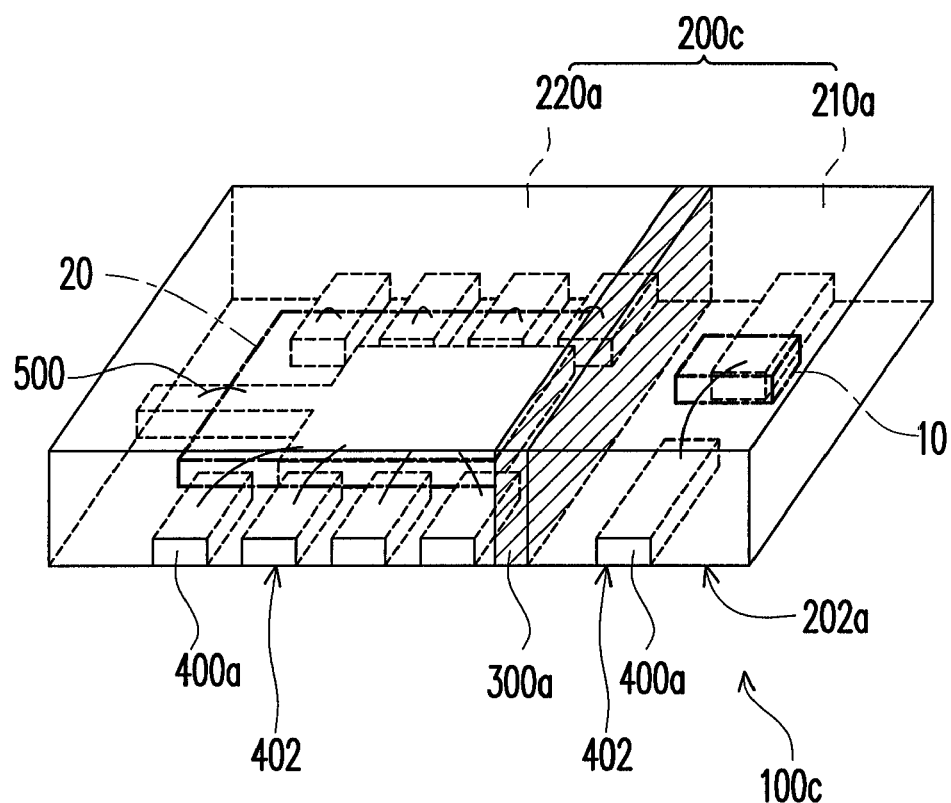
FIG. 4 is a perspective view of a package carrier according to another embodiment of the present invention.

FIG. 4 is a perspective view of a package carrier according to another embodiment of the present invention. It is noted that the signal processing unit 22 and control unit 24 of the light receiving device 20 are not shown in FIG. 4 for ease of description. Referring to FIGS. 1 and 4, the package carrier 100c of FIG. 4 is similar to the package carrier 100a of FIG. 1 except that the carrier substrate 200c of the package carrier 100c of FIG. 4 does not include the first recess 230 and the second recess 240 illustrated in FIG. 1.

More specifically, in the present embodiment, the metal contacts 400a are positioned in the first carrying area 210a and the second carrying area 220a, respectively. The light emitting device 10 and the light receiving device 20 are positioned with respect to the metal contacts 400a via a die attach process and subsequently electrically connected with the metal contacts 400a via wire bonding. Bottom portions 402 of the metal contacts 400a are exposed from a bottom portion 202a of the carrier substrate 200c, and the carrier substrate 200c may be electrically connected with an external circuit via the bottom portions 402 of the metal contacts 400a. It is noted that, in fabricating the package, the light emitting device 10 and the light receiving device 20 are electrically connected to the metal contacts 400a via the lead wires 500 after the metal contacts 400a and the metal sheet 300a are formed. Subsequently, the carrier substrate 200c is molded with transparent plastic material to complete the package. In addition, the curvature of the transparent plastic material above the light emitting device 10 and the light receiving device 20 can be designed to enhance the detection range.

In summary, the carrier substrate of the present invention can carry the light emitting device and the light receiving device at the same time, and the optical signal transmission between the light emitting device and the light receiving device can be effectively blocked by the metal sheet disposed between the two carrying areas. Therefore, the package carrier of the present invention can solve the problem of the conventional packages that the optical signals are inter-transmitted through the carrier body. The package also has the advantages of being able to reduce the size of the whole package as well as facilitate assembly of semiconductor devices (e.g. the light emitting device, light receiving device). In addition, since the metal material and the plastic are used to form the package carrier by stamping and injection-molding (or molding) in the present invention, the fabrication cost can be effectively reduced when compared with the conventional approach of fabricating with ceramic material.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A package carrier for carrying at least one light emitting device and at least one light receiving device, the package carrier comprising:

a carrier substrate comprising a first carrying area and a second carrying area, the light emitting device disposed in the first carrying area, the light receiving device disposed in the second carrying area; and a metal sheet disposed in the carrier substrate and located between the first carrying area and the second carrier area, the metal sheet adapted to block transmission of an optical signal between the light emitting device and the light receiving device and avoid the optical signal generated by the light emitting device from being directly received by the light receiving device.

2. The package carrier according to claim 1, wherein both the length and width of the carrier substrate are less than 10 mm and the height of the carrier substrate is less than 2.0 mm.

3. The package carrier according to claim 1, wherein the light emitting device is adapted to emit a light, and the light includes visible light or invisible light.

4. The package carrier according to claim 1, wherein the light receiving device comprises a signal processing unit for processing a light signal received by the light receiving device, and a control unit for controlling the light emitting device.

5. The package carrier according to claim 1, further comprising a plurality of metal contacts, wherein each of the metal contacts comprises an inner pin portion and an outer pin portion, the carrier substrate further comprises at least one first recess disposed in the first carrying area and at least one second recess disposed in the second carrying area, the inner pin portions of the metal contacts are disposed in the first recess and the second recess respectively, the light emitting device is disposed in the first recess, the light receiving device is disposed in the second recess, the light emitting device and light receiving device are electrically connected with the inner pin portions of the metal contacts via wire bonding.

6. The package carrier according to claim 5, wherein the outer pin portions of the metal contacts are exposed from the carrier substrate and the carrier substrate is electrically connected with an external circuit via the outer pin portions of the metal contacts.

7. The package carrier according to claim 5, wherein the inner pin portions of the metal contacts in the first recess are electrically connected with the inner pin portions of the metal contacts in the second recess via the metal sheet.

8. The package carrier according to claim 5, wherein the metal contacts and the metal sheet are formed at the same time.

9. The package carrier according to claim 1, further comprising a plurality of metal contacts disposed in the first carrying area and the second carrying area, wherein the light emitting device and the light receiving device are electrically connected with the metal contacts via wire bonding.

10. The package carrier according to claim 9, wherein bottom portions of the metal contacts are exposed from a bottom portion of the carrier substrate, and the carrier substrate is electrically connected with an external circuit via the bottom portions of the metal contacts.

11. The package carrier according to claim 9, wherein the metal contacts and the metal sheet are formed at the same time.

12. The package carrier according to claim 1, wherein the material of the carrier substrate comprises plastic.

* * * * *